United States Patent [19]

Yoshida

[11] 4,209,735

[45] Jun. 24, 1980

[54] SOLAR BATTERY POWERED ELECTRONIC CALCULATOR

[75] Inventor: Yoshisaburo Yoshida, Nara, Japan

[73] Assignee: Sharp Kabushiki Kaisha, Osaka, Japan

[21] Appl. No.: 837,288

[22] Filed: Sep. 27, 1977

[30] Foreign Application Priority Data

Sep. 29, 1976 [JP] Japan ............................ 51/132062[U]

[51] Int. Cl.$^2$ ...................... H01J 39/12; H01L 31/00; H02J 7/00

[52] U.S. Cl. .................................. 320/2; 136/89 AC; 250/215

[58] Field of Search ...................... 320/2, 61; 58/23 C; 136/206, 213, 89 AC, 89 P; 323/15; 250/215

[56] References Cited

U.S. PATENT DOCUMENTS

| | | | |
|---|---|---|---|
| 2,951,163 | 8/1960 | Shaffer et al. | 320/2 X |
| 4,017,725 | 4/1977 | Roen | 320/2 X |
| 4,087,960 | 5/1978 | Koichi | 136/89 AC X |

FOREIGN PATENT DOCUMENTS 1128367  4/1962  Fed. Rep. of Germany .......... 58/23 C Primary Examiner—Robert J. Hickey
Attorney, Agent, or Firm—Birch, Stewart, Kolasch and Birch

[57] ABSTRACT

A solar battery panel is installed on an electronic calculator through an arrangement formed on a rear casing of the electronic calculator or on a glass substrate supporting a display unit, a semiconductor chip, and wiring leads. The solar battery panel is exposed to light through a window formed on the rear casing or a rear casing over the glass substrate. A wallet is provided for protecting and supporting the electronic calculator. The solar battery panel is exposed to the outside through a window in the wallet even when the wallet is surrounding the electronic calculator.

8 Claims, 9 Drawing Figures

SOLAR BATTERY POWERED ELECTRONIC CALCULATOR

BACKGROUND OF THE INVENTION

The present invention relates to a solar battery powered electronic calculator and, more particularly, to an improved electronic calculator with a solar battery panel.

In a prior art electronic calculator with a solar battery panel, the solar battery panel is installed on the surface of a hood means used for introducing light onto a display or on the front surface of the electronic calculator extending between the display and the key input means for introducing numeral information or function commands into the calculator. However, the above described solar battery panel could not be arranged to extend over a wide area on the electronic calculator and the hood means is small in size. Furthermore, the solar battery panel installed between the display and said key input unit might be damaged because of undersirable contact by the operator when the electronic calculator is being operated.

OBJECTS AND SUMMARY OF THE INVENTION

Accordingly, it is an object of the present invention to provide an improved electronic calculator with a solar battery panel.

It is another object of the present invention to provide an improved electronic calculator with a solar battery panel which is arranged on a rear casing of the electronic calculator.

It is still another object of the present invention to provide an improved electronic calculator with a solar battery panel which is arranged directly on a portion of the electronic calculator. The electronic calculator is surrounded by a wallet such that the solar battery panel is exposed to external light.

To achieve the above objectives, pursuant to an embodiment of the present invention, a solar battery panel for powering an electronic calculator is arranged on a rear casing of the electronic calculator. In one preferred form, a wallet is provided within the electronic calculator for protecting and supporting the electronic calculator. The solar battery panel for the electronic calculator is exposed to light through a window formed in the wallet.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE PREFERRED EMBODIMENTS

Figure 1:
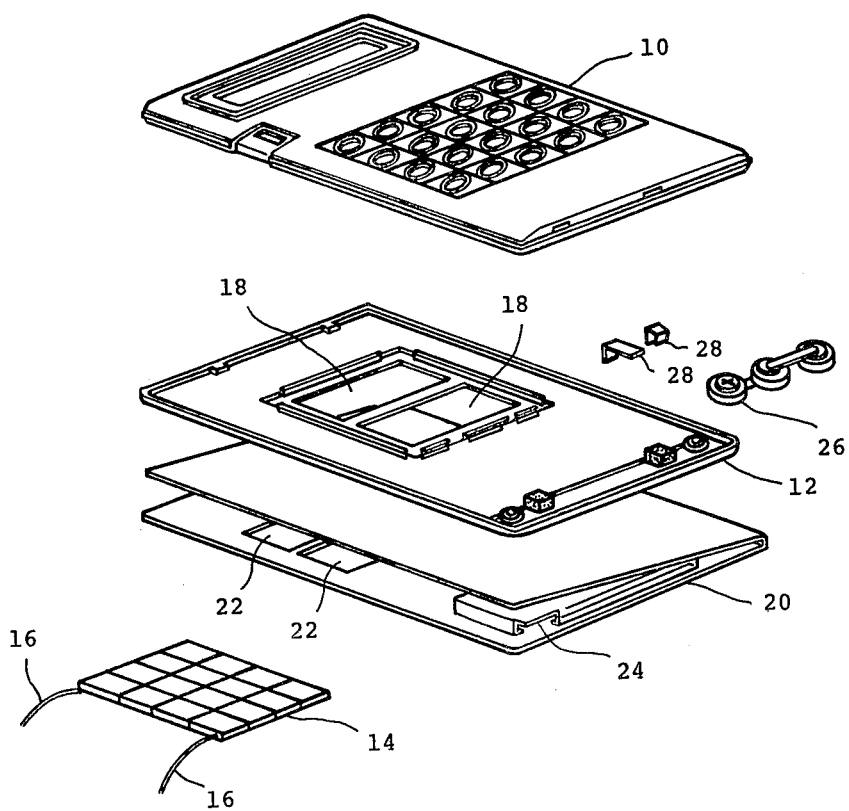
FIG. 1 is an exploded view of an electronic calculator with the solar battery panel embodying the present invention, wherein a computation unit or the like accommodated between upper and lower casings of the electronic calculator is omitted for convenience sake.

FIG. 1 shows an embodiment of an electronic calculator with a solar battery panel embodying the present invention, without showing various components of the calculator accommodated between a top casing 10 and a bottom casing 12 for the electronic calculator.

As is well known in the art of electronic calculators, a calculator comprises a key input means for the introduction of digital information and various function instructions, a computation circuit for receiving said digital information and said various function instructions for mainpulation purposes, and a display for visually indicating information processed through said computation circuit.

A solar battery panel 14 which comprises one or more solar cells, is arranged on the bottom casing 12 for receiving light and providing sufficient power energy to the electronic calculator through leads 16. The solar battery panel 14 is positioned at windows 18 formed on the bottom casing 12. A wallet 20 having windows 22 is provided for protecting and supporting the electronic calculator through a pouch 24 formed thereon.

A Ni-Cd battery 26 is provided within the electronic calculator for receiving and charging the power energy supplied from said solar battery panel 14 through battery terminals 28.

The power energy stored in the Ni-Cd battery 26 is consumed for calculation through the actuation of a power switch while the electronic calculator is being operated.

Figure 2:
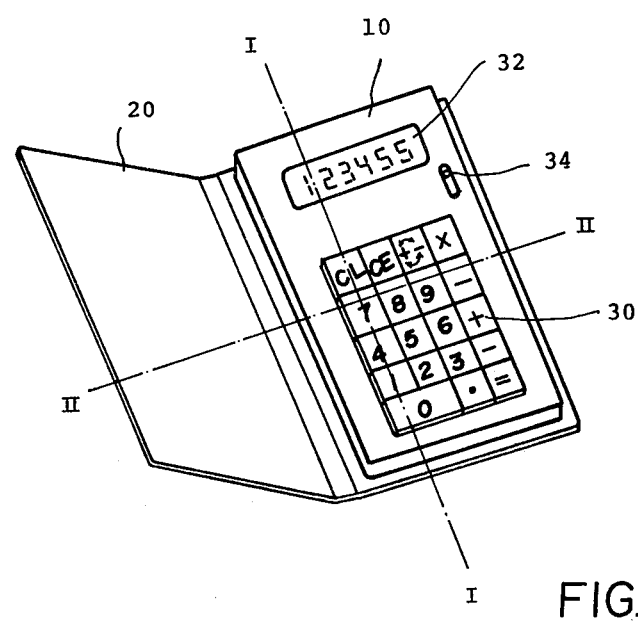
FIG. 2 is a perspective view of another embodiment of the present invention, wherein the electronic calculator is contained within a wallet.

FIG. 2 shows another embodiment of an electronic calculator with solar battery panels of the present invention, wherein like elements corresponding to those of FIG. 1 are indicated by like numerals.

Figure 3:
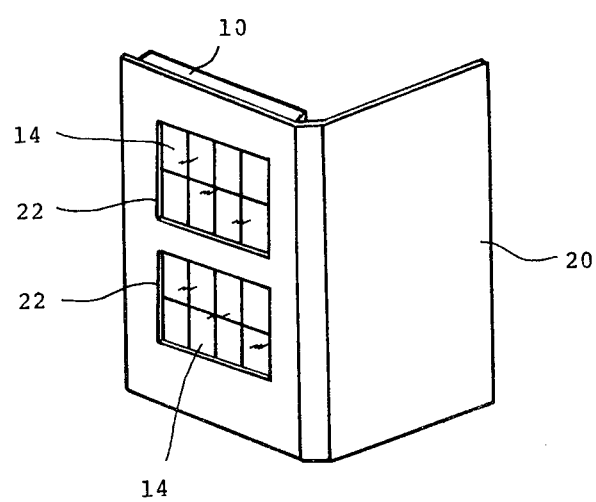
FIG. 3 is a rear view of the electronic calculator provided with the solar battery panels of FIG. 2.

The electronic calculator supported by the wallet 20 comprises the top casing 10, a key input unit 30, display 32 made of liquid crystal material, and a power switch 34. FIG. 3 shows a rear view of the electronic calculator of FIG. 2. The solar battery panels 14 arranged on the electronic calculator are exposed to light through the windows 22 formed on the wallet 20, whereby the solar battery panels 14 generate the power energy to be applied to the electronic calculator within the wallet 20.

Figure 4A:
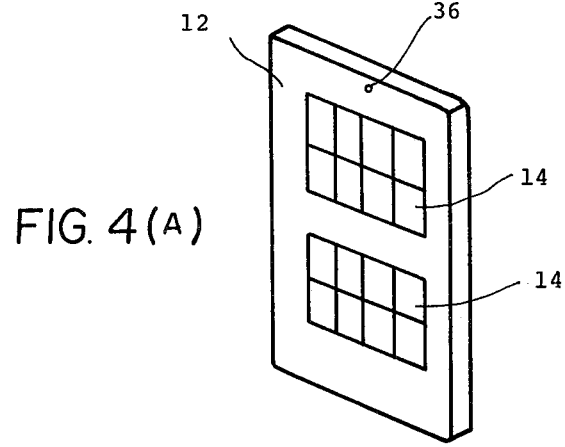
FIG. 4(A) is a perspective view of the electronic calculator of FIG. 2.
Figure 4B:
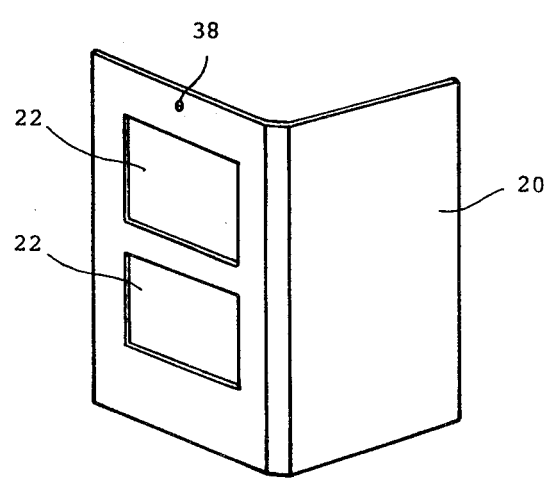
FIG. 4(B) is a perspective view of the case means of FIG. 2.
Figure 5:
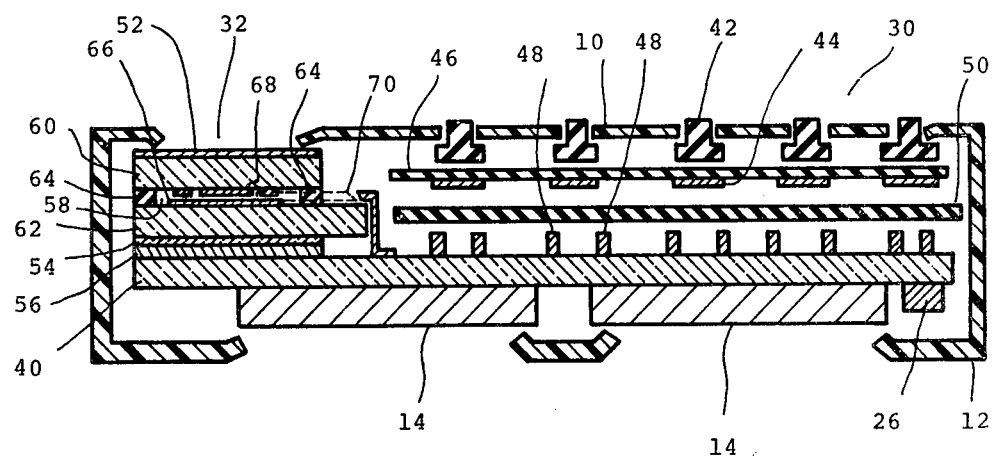
FIG. 5 is a sectional view of the electronic calculator taken along the line I—I in FIG. 2.

FIGS. 4(A) and 4(B) show the electronic calculator with solar battery panels 14 and the wallet 20, respectively. The two solar battery panels 14 are exposed to the outside through the windows 18 formed on the bottom 12. A connection hole 36 is formed in the bottom casing 12 of the electronic calculator for tightly securing the electronic calculator within the wallet 20. The windows 22 are employed within the wallet 20 for applying light exposure to the solar battery panels 14. A rising connector 38 is formed on the case 20 to correspond to the connection hole 36 on the electronic calculator side. FIG. 5 shows the electronic calculator of FIG. 4(A) in a longitudinal sectional view. Like elements corresponding to those of FIG. 2 are indicated by like numerals. As stated above, the electronic calculator mainly comprises the top casing 10, the bottom casing 12, the key input unit 30, and the display 32. A glass substrate 40 supports the solar battery panels 14 adhered thereto with an appropriate bond. Key input information is introduced in response to the actuation of the key top 42 and, simultaneously, the contact is made between an electrically conductive rubber 44 formed on an insulation plate 46 and respective key terminals 48 formed on the glass substrate 40. An isolation spacer 50 keeps the respective electrically conductive rubber 44 away from key terminals 48. The Ni-Cd battery 26 is positioned on the glass substrate 40 for receiving the power energy derived from the solar battery panels 14. The glass substrate 40 is utilized for arranging wiring means for the electronic calculator.

Since the display 32 comprises liquid crystal material of the field effect mode, polarizers 52, 54 and reflector 56 made of aluminum are provided and crystal material 58 is filled between glass plates 60, 62 and spacer means 64. A common electrode 66 is formed on the glass plate 62 and segment electrodes 78 are arranged on the glass plate 60. The common electrode 66 and the segment electrode 68 are connected to the computation circuit (not shown) of the electronic calculator via wiring means 70.

Figure 6:
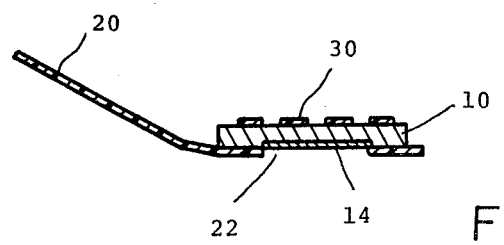
FIG. 6 is a sectional view taken on the line II—II in FIG. 2.
Figure 7:
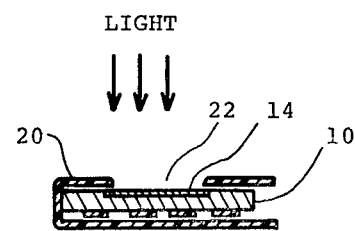
FIG. 7 is a cross-sectional view of the electronic calculator with solar battery panels of FIG. 2.

FIG. 6 shows the electronic calculator with solar battery panels 14 in a sectional view taken on the line II—II in FIG. 2. FIG. 7 shows the electronic calculator with the solar battery panels 14 closely covered with the wallet 20, the solar battery panels 14 of the electronic calculator being exposed to light to supply the power energy to the electronic calculator.

Figure 8:
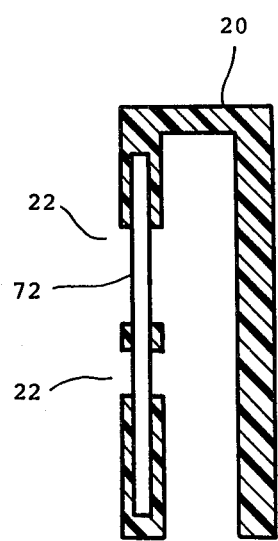
FIG. 8 is a longitudinal sectional view of another wallet.

FIG. 8 shows another wallet case 20 which has a transparent substrate 72 made of glass or acrylic acid resin with transparent windows 22 for light exposure of the solar battery panel 14.

The thus constructed wallet 20 permits the solar battery panel 14 to be safely protected from the environment. The transparent substrate 72 is inserted into the wallet 20.

The invention being thus described, it will be obvious that the same may be varied in many ways. Such variations are not to be regarded as a departure form the sprit and scope of the invention, and all such modifications are intended to be included within the scope of the following claims.

What is claimed is:

1. A solar battery-powered electronic calculator comprising a top casing and an opposing bottom casing, said top casing containing a key input unit having a plurality of keys, and a liquid crystal display unit, said liquid crystal display unit having a liquid crystal mixture confined therein and means for activating the liquid crystal mixture so as to change the visibility of the liquid crystal mixture according to applied light, a substrate disposed between the top casing and the bottom casing, an insulating layer disposed between the key input unit and the substrate, said insulating layer containing contact means facing said bottom casing and positioned to correspond to said keys, key terminals and said liquid crystal display disposed on said substrate facing said top casing, said key terminals being positioned for contact with the contact means upon actuation of said keys, a solar battery panel rigidly disposed on said substrate facing said bottom casing, and window means provided in said bottom casing and positioned to correspond to the location of the battery panel for introducing light to said solar battery panel.

2. The solar battery-powered electronic calculator of claim 1, whereing the window means contains a transparent substrate for supplying light to the solar battery panel.

3. The solar battery-powered electronic calculator of claim 2, wherein the transparent substrate is made of a material selected from the group consisting of glass and an acrylic acid resin.

4. The solar battery-powered electronic calculator of claim 1, wherein the casing is disposed within a wallet containing window means positioned to accommodate the window means in said bottom casing.

5. A solar battery-powered electronic calculator comprising a casing having two major surfaces, a key input unit and a liquid crystal display unit contained in one of said surfaces, said key input unit containing a plurality of keys, said liquid crystal display unit having a liquid crystal mixture confined therein and means for actuating the liquid crystal mixture so as to change the visibility of the liquid crystal mixture according to applied light, a substrate disposed between said two major surfaces, an insulating layer disposed between the key input unit and the substrate, said insulating layer containing contact means positioned to correspond to said keys, key terminals and said liquid crystal display unit disposed on said substrate, said key terminals being positioned to engage said contact means, a solar battery panel rigidly disposed to face one of the surfaces of said casing, and window means provided in said casing and positioned to correspond to the location of the battery panel for introducing light to said solar battery panel.

6. The solar battery-powered electronic calculator of claim 5, wherein the window means contains a transparent substrate for supplying light to the solar battery panel.

7. The solar battery-powered electronic calculator of claim 6, wherein the transparent substrate is made of a material selected from the group consisting of glass and an acrylic acid resin.

8. The solar battery-powered electronic calculator of claim 5, wherein the casing is disposed within a wallet containing window means positioned to accommodate the window means in said casing.

* * * * *